United States Patent

[11] 3,629,710

[72] Inventor Douglas H. Durland
Palo Alto, Calif.
[21] Appl. No. 98,724
[22] Filed Dec. 16, 1970
[45] Patented Dec. 21, 1971
[73] Assignee Beckman Instruments, Inc.

[54] DIGITALLY CONTROLLED PULSE GENERATOR
10 Claims, 1 Drawing Fig.

[52] U.S. Cl. .......... 328/58, 235/92 TF, 307/265, 307/220 R, 328/43, 328/48, 328/61, 328/110
[51] Int. Cl. .......... H03k 5/04, H03k 23/02
[50] Field of Search .......... 307/260, 265, 266, 267, 271; 328/41, 43, 48, 58, 60, 61, 110; 235/92 T, 92 TF

[56] References Cited

UNITED STATES PATENTS

| | | | |
|---|---|---|---|
| 2,665,411 | 1/1954 | Frady, Jr. | 235/92 MT |
| 3,064,890 | 11/1962 | Butler | 328/43 X |
| 3,277,473 | 10/1966 | Calhoon, Sr. et al. | 235/92 T |
| 3,401,343 | 9/1968 | O'Lear | 328/41 |
| 3,418,586 | 12/1968 | Asher | 307/271 X |
| 3,489,925 | 1/1970 | Bjerke | 307/260 X |
| 3,551,657 | 12/1970 | Darrington | 235/151.33 |
| 3,576,497 | 4/1971 | Miller | 307/222 R |

*Primary Examiner*—Donald D. Forrer
*Assistant Examiner*—L. N. Anagnos
*Attorneys*—Richard M. Jennings and Robert J. Steimeyer

ABSTRACT: A digitally controlled pulse generator whose duty cycle may be rapidly and accurately varied to supply a load with a required amount of power including a data register, a recirculating counter, a coincidence detector connected to the memory unit and the recirculating counter for providing an output signal when the count stored in the memory unit coincides with that in the recirculating counter and a bistable storage element having one input connected to the coincidence detector and a second input connected to the counter such that the storage element is set in one state each time the coincidence detector provides an output signal and in the other state each time the counter recycles to zero.

PATENTED DEC 21 1971 3,629,710
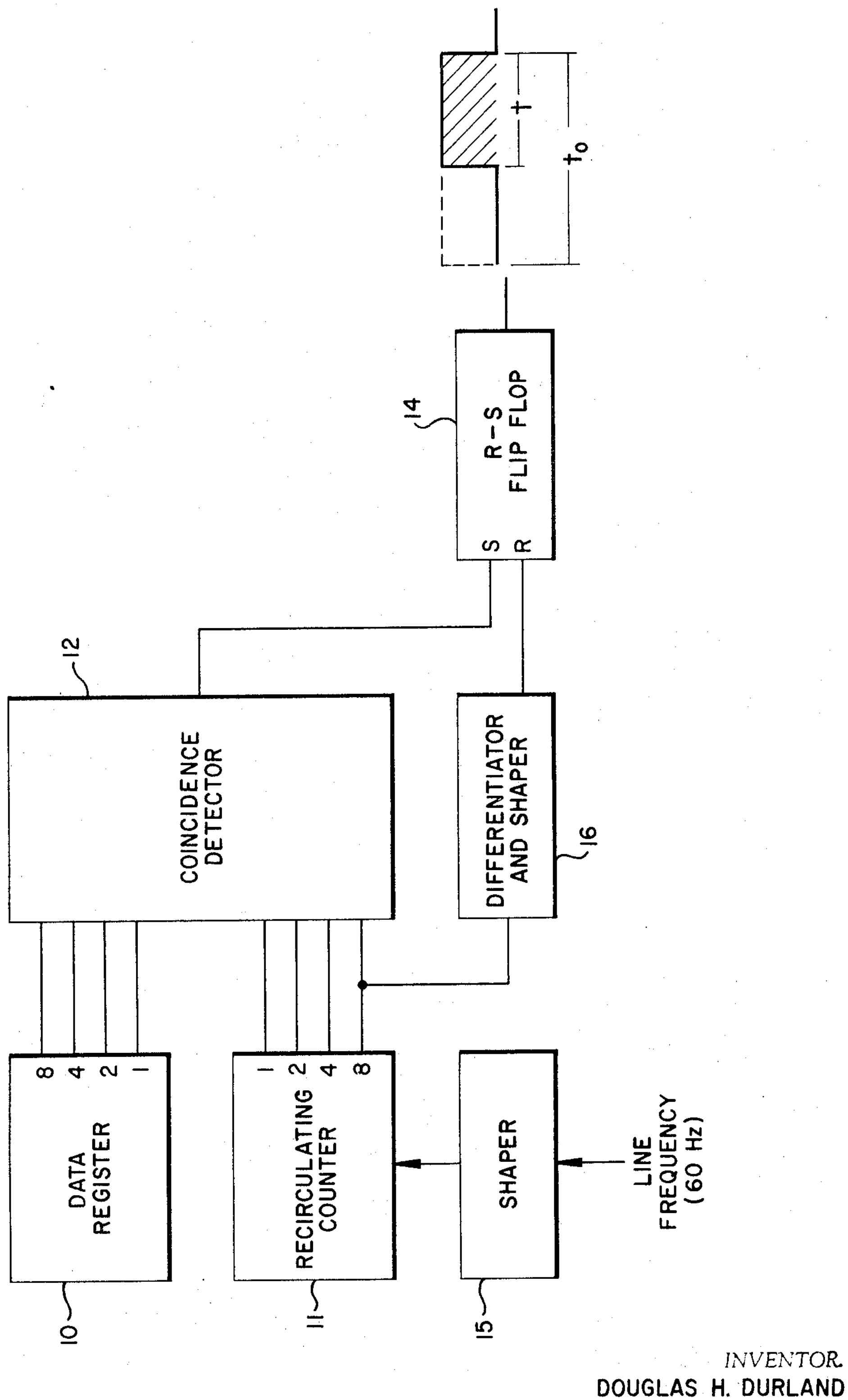
INVENTOR.
DOUGLAS H. DURLAND
BY Richard M Jennings

DIGITALLY CONTROLLED PULSE GENERATOR

BACKGROUND OF THE INVENTION

1. Field of the Invention

This invention relates in general to pulse generators and more particularly to a digitally controlled pulse generator whose duty cycle may be rapidly and accurately varied over a range from 0 to 100 percent to control the amount of power delivered to a selected load.

2. Description of the Prior Art

In today's electronic environment and integrated circuit technology the emphasis is on high-speed, reliable, low-cost and accurate devices for deriving a pulse signal whose time duration relative to a selective time interval may be readily and accurately varied. The general concept of comparing a digitized number stored in a suitable memory unit to a continuous count reflected by a counter has been employed in numerous digital-to-analog converters. Typical examples are exemplified by U.S. Pat. Nos. 3,349,230; 3,371,334; 3,267,429; and 2,907,021. However, such a concept has not been utilized in a digitally controlled pulse generator to permit the easy and rapid adjustment of the pulse generator duty cycle and, thus, accurately control the amount of power being delivered to a suitable load. Heretofore, when converting a digitized signal into a time proportional control signal it has been the general practice to first perform a normal digital-to-analog conversion step, such as by means of a conventional voltage-switched resistor ladder network, followed by a conversion of the resulting analog signal to the desired time proportional signal by way of a silicon-controlled rectifier or other suitable time proportioning conversion element. Such a method contributed greatly to the complexity of the conversion apparatus resulting in a higher cost and lower speed device.

SUMMARY OF THE INVENTION

The present invention contemplates a high-speed, reliable, low-cost, digitally controlled pulse generator consisting of a limited number of components and whose duty cycle may be rapidly and accurately varied. To this end in accordance with the principles of the resent invention, there is provided a data register or memory unit, a recirculating counter, a coincidence detector for monitoring the outputs form both the memory unit and the recirculating counter and providing an output signal each time the count in the memory unit and the recirculating counter coincides and a bistable storage element having two inputs one of which is connected to the coincidence counter and the other of which is connected directly to the recirculating counter. The bistable element is set in one of its states upon the occurrence of a pulse from the coincidence detector and reset to its original state each time the recirculating counter reaches a zero count to provide a pulse output signal whose time duration is a certain percentage of a selected time interval which percentage is a function of the ratio of the value of the number stored in the memory unit to the number representing the full capacity of the recirculating counter.

Accordingly, a primary object of the present invention is the provision of an improved pulse generator whose duty cycle may be rapidly and accurately varied.

A further object is the provision of a high-speed, reliable, low-cost pulse generator.

Still a further object is the provision of a pulse generator with a limited number of components.

These and other objects and advantages of the invention will become apparent from the following detailed description read in conjunction with the accompanying drawings.

DETAILED DESCRIPTION OF THE DRAWINGS

The FIGURE illustrates in block diagram form the digitally controlled pulse generator constructed in accordance with the principles of the present invention.

With reference now to the drawing it will be observed that the pulse generator comprises generally a data register or memory unit 10, a recirculating counter 11, a coincidence detector 12, and a bistable storage element 14.

Memory unit 10 serves as an input source of the digital information and comprises a four-bit data register with four parallel binary coded output lines labeled 1, 2, 4 and 8, respectively, after the conventional binary weighted code. Memory unit 10 may typically comprise a plurality of appropriately cascaded bistable elements, such as flip-flops, or square loop hysteresis magnetic core elements. The digitized input signal may be entered into the memory unit 10 in a serial or parallel fashion at the choice of the operator.

Recirculating counter 11, like memory unit 10, comprises a plurality of conventional bistable elements, such as flip-flops or square loop hysteresis magnetic core elements, connected in cascade and in the illustrated embodiment consists of a four-bit recirculating counter with four parallel binary output lines designated 1, 2, 4, and 8, respectively. REcirculating counter 11 is driven by the AC line frequency signal, typically 60 Hz. which is coupled to the counter 11 by way of a conventional pulse shaper element 15. Instead of driving the counter directly from the power line, a conventional clock pulse source whose frequency may be varied over a wide range may be utilized. In either event the counter 11 is stepped one increment for each pulse input and upon reaching its maximum count, which in the illustrated embodiment is 15, resets to zero and begins to recount. It will be appreciated by those skilled in the art that while memory unit 10 and recirculating counter 11 are shown as four-bit binary coded elements, other conventional codes may be utilized and the number of bits is merely dependent upon the degree of resolution desired.

The counts stored in data register 10 and recirculating counter 11 are continuously monitored by coincidence detector 12 which produces a output pulse on line 13 each time the count stored in the memory unit 10 matches or coincides with that in recirculating counter 11. Coincidence detector 12 may typically comprise a plurality of NOR or NAND gates or exclusive OR circuits (one for each stage in data register 10), each having a pair of input lines one of which is connected to the output of one stage in data register 10 and the other of which is connected to the output of a corresponding stage is recirculating counter 11.

Bistable storage element 14 comprises a conventional reset-set flip-flop having its set input line (S) connected directly to the output of coincidence detector 12 and its reset input line (R) connected to the output of the last stage of recirculating counter 11 by way of a differentiating and shaping circuit 16. Flip-flop 14 responds to the pulse output derived from coincidence detector 12 to place the flip-flop in its high state and remains in this high state until counter 11 reaches its maximum count at which time a pulse is impressed upon the reset input (R) of flip-flop 14 to reset the flip-flop to its original low state.

To facilitate a complete understanding of the present invention it is believed a brief review of the meaning of "duty cycle" will be helpful. Classically the "duty cycle" of an electrical device is defined as the ratio of its on time interval to the total time of one complete cycle. IN the illustrated embodiment this would mean that the duty cycle of flip-flop 14 is defined by the ratio of the duration ($t$) of the pulse provided at its output to the time interval ($t_0$) during which the pulse occurs which represents the time required for the flip-flop to cycle from its original reset state to its set state and return to its reset state. Accordingly, as the ratio ($t/t_0$) increases the duty cycle of flip-flop 14 becomes greater. Conversely as the ratio ($t/t_0$) decreases the flip-flop 14 duty cycle becomes less.

Turning now to the operation of the pulse generator in accordance with the principles of the present invention, for purposes of description assume that initially a value equal to the number 8 has been entered into data register 10. This means that parallel binary coded output lines 1, 2, 4 and 8 of data register 10 reflect 0, 0, 0, and 1, respectively. (Representing the value 8 in binary code.) Recirculating counter 11 is then activated by connecting it to the power source. When the recirculating counter reaches the count 8 coincidence detector 12 provides a pulse output which is impressed upon the set input (S) of flip-flop 14 switching flip-flop 14 to its high state. Flip-flop 14 then remains in such a high state until recirculating counter 11, which is continuously driven at the line frequency, reaches its maximum count, in this case 15, and then recycles to zero at which time a pulse is fed from the last stage of recirculating counter 11 to the reset input (R) of flip-flop 14 resetting the flip-flop to its original low state.

Thus, flip-flop 14 provides a pulse output whose duty cycle ($t/t_0$) is a function of the ratio of the number entered into the data register 10 the maximum count of the recirculation counter. In mathematical terms the duty cycle of the pulse generator may be expressed as follows:

$$Z=(Y-X)/Y$$

where $Z$ is equal to the duty cycle expressed in percentage terms, $X$ is equal to the number entered into data register 10 and $Y$ is equal to the number representing the full capacity or maximum count of the recirculating counter 11.

It will be appreciated that the duty cycle of the pulse generator may be varied by merely changing the number ($X$) entered into data register 10 or increasing or decreasing the maximum count ($Y$) of recirculating counter 11. Moreover, while the pulse duty cycle remains constant when $X$ and $Y$ remain unchanged, the time duration ($t$) of each pulse generated as well as the total time interval ($t_0$) required for the recirculating counter 11 to reach its maximum count and recycle to zero is a direct function of the frequency of the clock pulse signal driving the counter 11. It follows that by adjusting the frequency of this clock source the time duration ($t$) of each pulse output signal may be varied. Finally, as previously noted, the resolution of the pulse generator is dependent upon the number of stages in recirculating counter 11, i.e., the greater the number of stages — the higher the resolution.

Numerous modifications and departures from the specific apparatus described herein may be made by those skilled in the art without departing from the inventive concept of the invention. For example, the complementary outputs from the data register rather than the direct outputs may be utilized, if desired. Accordingly, the invention is to be construed and is limited only by the spirit and scope of the appended claims.

What is claimed is:

1. A pulse generator comprising a digital storage means for storing a predetermined number, a recirculating counter, means for sequentially varying the state of said counter at a selected frequency, said recirculating counter providing a first output signal each time said counter recycles to a zero count, coincidence detecting means connected to said digital storage means and said recirculating counter for providing a second output signal when the count is said counter coincides with the number contained in said digital storage means, and a bistable means having a first input connected to said coincidence detecting means and a second input connected to said recirculating counter, said bistable means being responsive to each first output signal from said recirculating counter to switch to its first stable state and responsive to each second output signal from said coincidence detection means to switch to its second stable state to provide a pulse output signal whose duty cycle satisfies the equation:

$$Z=(Y-X)/Y$$

where $Z$ represents the duty cycle, $X$ is the number stored in the digital storage means, and $Y$ is the number representing the maximum count of the recirculating counter.

2. A pulse generator as defined in claim 1 wherein said bistable storage means comprises a reset-set flip-flop having its reset input connected to the output of said recirculating counter and its set input connected to said coincidence detection means.

3. A pulse generator as defined in claim 2 wherein aid sequential varying means comprises a clock pulse source.

4. A pulse generator as defined in claim 1 wherein said recirculating counter includes a plurality of stages with a parallel number output and said memory circuit includes a plurality of stages equal to the number of stages in said recirculating counter having a parallel number output, each of the counter stages providing a complementary number output.

5. A digitally controlled pulse generator whose duty cycle may be readily and accurately varied comprising a recirculating counter having a plurality of parallel binary number outputs $B_1, B_2, B_3 \ldots B_N$, where the subscripts indicate the order of binary number bit, means for sequentially varying the count of said counter at a selected frequency, said counter providing a first output signal each time the counter recycles to a zero count, a memory circuit having a plurality of parallel binary number outputs $B_1, B_2, B_3 \ldots B_N$, coincidence detection means connected to said recirculating counter and said memory circuit for continuously monitoring the parallel number outputs indicated by said counter and said memory circuit and providing a second output signal when said number outputs coincide, and a bistable storage means having first and second stable states connected to said recirculating counter and said coincidence detection means, said bistable storage means being set in its first stable state in response to each first output signal produced by said recirculating counter and in its second stable state each time said coincidence detector provides a second output signal to provide a pulse output having a duty cycle satisfying the equation:

$$Z=(X-Y)/Y$$

where $Z$ represents the duty cycle, $X$ is the number stored in the memory circuit, and $Y$ is the number representing the maximum count of the recirculating counter.

6. A pulse generator as defined in claim 5 wherein said bistable storage means comprises a set-reset flip-flop with its set input connected to said coincidence detector and its reset input connected to the last stage of said recirculating counter.

7. A pulse generator as defined in claim 6 wherein said sequential varying means comprises an adjustable frequency clock pulse source.

8. A pulse generator comprising a digital storage means for storing a predetermined number, a recirculating counter, means for sequentially varying the state of said counter at a selected frequency, said recirculating counter providing a first output signal each time said counter recycles to a zero count, coincidence-detecting means connected to said digital storage means and said recirculating counter for providing a second output signal when the count in said counter coincides with the number contained in said digital storage means, and a bistable means having a first input connected to said coincidence detecting means and a second input connected to said recirculating counter, said bistable means being responsive to each first output signal from said recirculating counter to switch to its first stable state and responsive to each second output signal from said coincidence detection means to switch to its second stable state to provide a pulse output signal whose duty cycle varies as a function of the ratio of the number in the digital storage means to the maximum count of the recirculating counter.

9. A pulse generator as defined in claim 8 wherein said digital storage means and said recirculating counter each provide a plurality of parallel binary number outputs.

10. A pulse generator as defined in claim 9 wherein one of said plurality of binary number outputs is the complement of the direct output.

* * * * *